(12) United States Patent
Takizawa et al.

(10) Patent No.: US 10,453,770 B2
(45) Date of Patent: Oct. 22, 2019

(54) POWER CONVERTER AND POWER CONVERTER FOR RAILROAD VEHICLE

(71) Applicant: FUJI ELECTRIC CO., LTD., Kawasaki-shi, Kanagawa (JP)

(72) Inventors: Masamitsu Takizawa, Suzuka (JP); Nobuyuki Kobayashi, Uenohara (JP); Yoshio Mori, Suzuka (JP); So Nakamichi, Suzuka (JP); Kohei Matsui, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/170,439

(22) Filed: Oct. 25, 2018

(65) Prior Publication Data

US 2019/0148259 A1    May 16, 2019

(30) Foreign Application Priority Data

Nov. 15, 2017   (JP) ................. 2017-219730

(51) Int. Cl.
*H05K 7/20* (2006.01)
*H01L 23/367* (2006.01)
*H02M 7/00* (2006.01)
*H02M 5/458* (2006.01)
*H02M 7/487* (2007.01)

(52) U.S. Cl.
CPC ........ *H01L 23/3672* (2013.01); *H02M 7/003* (2013.01); *H05K 7/209* (2013.01); *H05K 7/20854* (2013.01); *H05K 7/20863* (2013.01); *H05K 7/20881* (2013.01); *H05K 7/20909* (2013.01); *H05K 7/20918* (2013.01); *H05K 7/20936* (2013.01); *H02M 5/4585* (2013.01); *H02M 7/487* (2013.01)

(58) Field of Classification Search
None
See application file for complete search history.

(56) References Cited

U.S. PATENT DOCUMENTS

| | | | |
|---|---|---|---|
| 6,434,003 B1 * | 8/2002 | Roy ................... | H05K 7/20927 165/104.22 |
| 8,159,823 B2 * | 4/2012 | Murakami ........... | H01L 23/473 180/243 |
| 9,192,079 B2 * | 11/2015 | Loth .................. | H05K 7/20918 |
| 9,943,007 B2 * | 4/2018 | Enami ................ | B61C 3/00 |
| 10,214,109 B2 * | 2/2019 | Gohara ............... | H01L 23/473 |
| 2010/0277871 A1 * | 11/2010 | Kitanaka .............. | B60L 9/16 361/710 |

(Continued)

FOREIGN PATENT DOCUMENTS

| | | |
|---|---|---|
| JP | 2007-104784 A | 4/2007 |
| JP | 2017-112690 A | 6/2017 |

*Primary Examiner* — Courtney L Smith
(74) *Attorney, Agent, or Firm* — Manabu Kanesaka

(57) ABSTRACT

In each of a plurality of semiconductor element groups of a power converter, a second semiconductor switching element and a third semiconductor switching element are shifted from each other in a second direction such that at least a portion of fins with which the second semiconductor switching element overlaps as viewed in a direction orthogonal to surfaces of coolers is different from fins with which the third semiconductor switching element overlaps as viewed in the direction orthogonal to the surfaces of the coolers.

12 Claims, 9 Drawing Sheets

(56) References Cited

U.S. PATENT DOCUMENTS

| | | | |
|---|---|---|---|
| 2012/0235162 A1* | 9/2012 | Isobe | H01L 23/467 257/77 |
| 2013/0025837 A1* | 1/2013 | Takenaga | H01L 23/473 165/168 |
| 2014/0159225 A1* | 6/2014 | Zushi | H01L 23/3735 257/690 |
| 2014/0268571 A1* | 9/2014 | Kang | G06F 1/20 361/699 |
| 2014/0301041 A1* | 10/2014 | Kitanaka | H02M 7/003 361/697 |

* cited by examiner

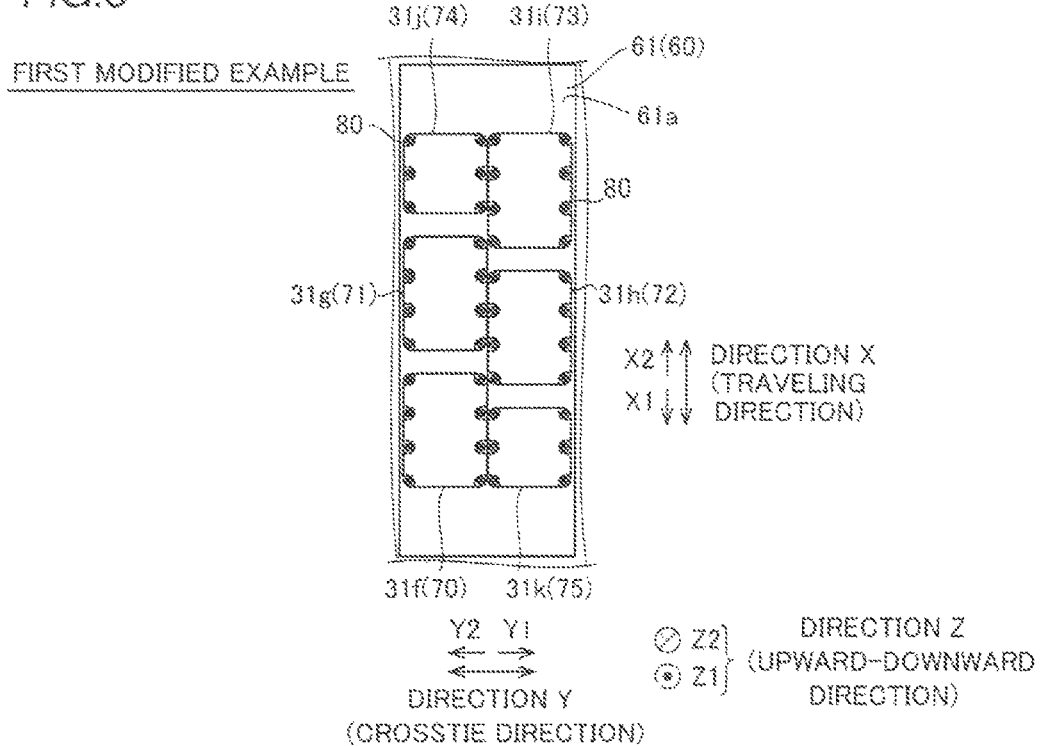
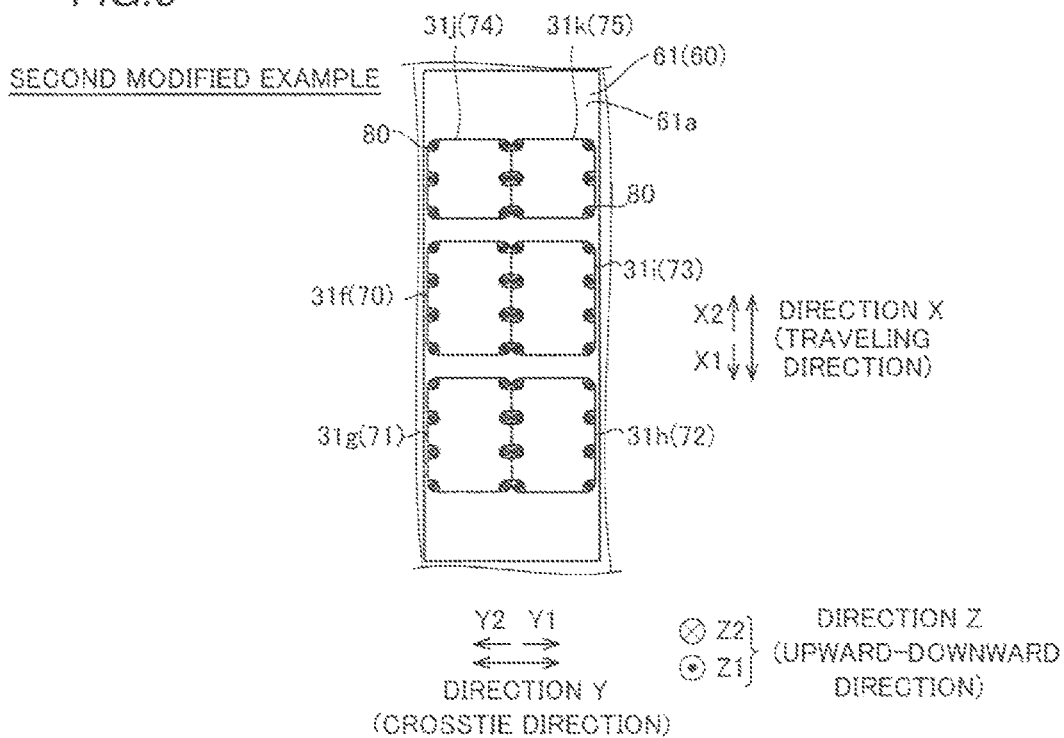

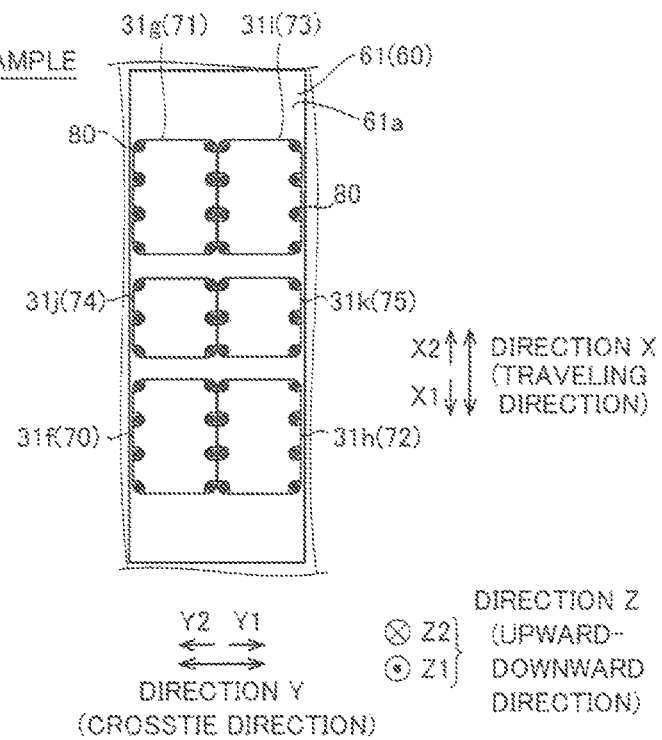
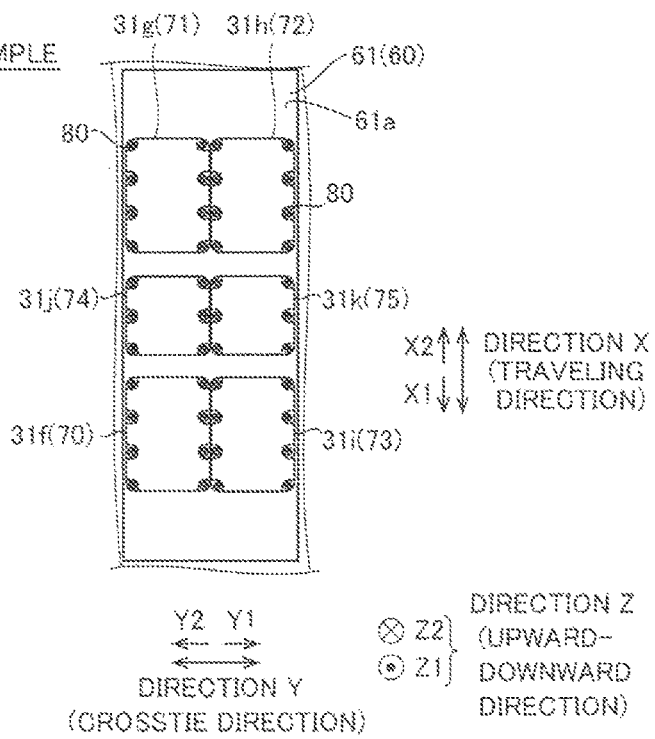

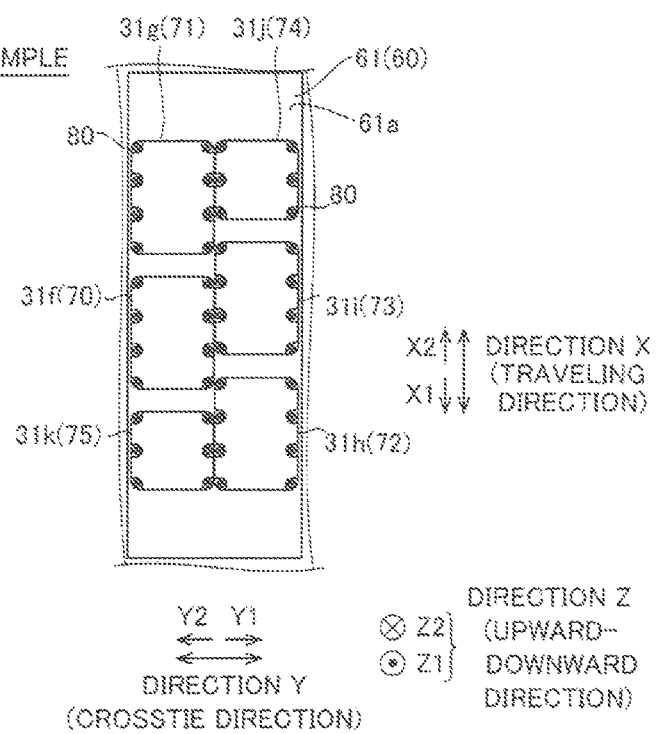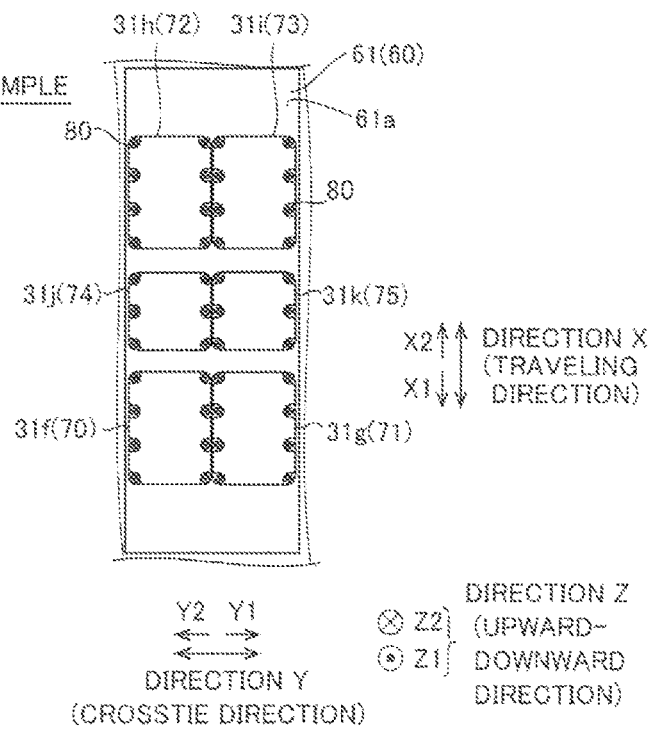

SEVENTH MODIFIED EXAMPLE

EIGHTH MODIFIED EXAMPLE

POWER CONVERTER AND POWER CONVERTER FOR RAILROAD VEHICLE

CROSS-REFERENCE TO RELATED APPLICATION

The present application claims priority of Japanese Patent Application No. 2017-219730 filed Nov. 15, 2017, the disclosure of which is hereby incorporated by reference.

BACKGROUND OF THE INVENTION

Field of the Invention

The present invention relates to a power converter and a power converter for a railroad vehicle, and more particularly, it relates to a power converter and a power converter for a railroad vehicle, both of which include a plurality of semiconductor element groups each including a plurality of semiconductor switching elements.

of Description the Background Art

A power converter and a power converter for a railroad vehicle, both of which include a plurality of semiconductor element groups each including a plurality of semiconductor switching elements is known in general, as disclosed in Japanese Patent Laid-Open No. 2007-104784.

A power converter disclosed in Japanese Patent Laid-Open No. 2007-104784 includes a power converter for a vehicle. This power converter includes a heat receiving block. On a semiconductor element mounting surface of the heat receiving block on one side, semiconductor element groups of a plurality of phases are provided. Furthermore, on a non-semiconductor element mounting surface of the heat receiving block on the other side, a heat radiator that radiates the heat of the semiconductor element groups is provided. The heat radiator includes a plurality of plate-shaped fins arrayed along the crosstie direction of the vehicle.

The semiconductor element groups of the plurality of phases are disposed side by side in the crosstie direction of the vehicle. Each of the semiconductor element groups of the plurality of phases includes four semiconductor elements Q1 to Q4 and two diode elements. Specifically, in each of the semiconductor element groups of the plurality of phases, the semiconductor element Q1, the semiconductor element Q2, the semiconductor element Q3, and the semiconductor element Q4 are connected in series in this order from the positive voltage side. Furthermore, the four semiconductor elements and the two diode elements are linearly aligned in a vehicle traveling direction. That is, the fins with which the four semiconductor elements Q1 to Q4 and the two diode elements overlap in a plan view are common to each other (the same as each other).

Here, a converter has a time during which the element loss is large, longer than that of an inverter. Among the four semiconductor elements Q1 to Q4, the semiconductor elements Q2 and Q3 that are frequently switched generate a larger amount of heat than the other elements. Therefore, in the power converter disclosed in Japanese Patent Laid-Open No. 2007-104784, heat of both the semiconductor element Q2 and the semiconductor element Q3 that generate a relatively large amount of heat is radiated by only the common fins, and thus the heat of the semiconductor element Q2 and the semiconductor element Q3 is not sufficiently radiated such that the temperatures of the semiconductor element Q2 and the semiconductor element Q3 are disadvantageously increased. Thus, the power converter may fail due to insufficient heat radiation.

SUMMARY OF THE INVENTION

The present invention has been proposed in order to solve the aforementioned problem, and an object of the present invention is to provide a power converter and a power converter for a railroad vehicle capable of significantly reducing or preventing failures caused by insufficient heat radiation.

In order to attain the aforementioned object, a power converter according to a first aspect of the present invention includes a plurality of semiconductor element groups each including a first semiconductor switching element, a second semiconductor switching element, a third semiconductor switching element, and a fourth semiconductor switching element connected in series to each other in this order, and coolers on which the plurality of semiconductor element groups is placed, including a plurality of plate-shaped fins that extends along a first direction, which is a direction in which cooling air flows. The plurality of plate-shaped fins is disposed side by side along a second direction orthogonal to the first direction, the plurality of semiconductor element groups is disposed side by side along the second direction so as to overlap with the fins on surfaces of the coolers opposite to surfaces on which the fins are provided, and in each of the plurality of semiconductor element groups, the second semiconductor switching element and the third semiconductor switching element are shifted from each other in the second direction such that at least a portion of the fins with which the second semiconductor switching element overlaps as viewed in a direction orthogonal to the surfaces of the coolers is different from the fins with which the third semiconductor switching element overlaps as viewed in the direction orthogonal to the surfaces of the coolers.

Here, each of the second semiconductor switching element and the third semiconductor switching element is more frequently switched than the first semiconductor switching element and the fourth semiconductor switching element, and thus the second semiconductor switching element and the third semiconductor switching element generate a relatively large amount of heat due to an increase in the switching loss. Therefore, in the power converter according to the first aspect of the present invention, as described above, the second semiconductor switching element and the third semiconductor switching element are shifted from each other in the second direction such that the second semiconductor switching element and the third semiconductor switching element can be cooled by the different fins. Thus, unlike the case in which both the second semiconductor switching element and the third semiconductor switching element are cooled by only the common fins, an increase in the temperature of each of the second semiconductor switching element and the third semiconductor switching element can be significantly reduced or prevented. Consequently, failures caused by insufficient heat radiation (of the second semiconductor switching element and the third semiconductor switching element) can be significantly reduced or prevented.

The plurality of semiconductor element groups is disposed side by side along the second direction (a direction in which the fins are aligned) such that unlike the case in which the plurality of semiconductor element groups is disposed side by side along the first direction (a direction in which the fins extend), the second semiconductor switching element and the third semiconductor switching element are not disposed side by side along the first direction (the direction in which the fins extend). Consequently, unlike the case in which the plurality of semiconductor element groups is disposed side by side along the first direction (the direction in which the fins extend), heat interference between the second semiconductor switching elements or heat interference between the third semiconductor switching elements can be reduced, and thus an increase in the temperature of each of the second semiconductor switching element and the third semiconductor switching element can be further significantly reduced or prevented.

In the aforementioned power converter according to the first aspect, in each of the plurality of semiconductor element groups, the second semiconductor switching element and one of the first semiconductor switching element and the fourth semiconductor switching element are preferably disposed in a row along the first direction, and the third semiconductor switching element and the other of the first semiconductor switching element and the fourth semiconductor switching element are preferably disposed in a row along the first direction. According to this structure, the two switching elements are disposed in a row along the first direction (the direction in which the fins extend), and thus as compared with the case in which one of the second semiconductor switching element and the third semiconductor switching element and both of the first semiconductor switching element and the fourth semiconductor switching element are disposed in a row along the first direction (the direction in which the fins extend) (the case in which three switching elements are disposed in a row), the temperature of one element (in the second semiconductor switching element and the third semiconductor switching element) described above can be effectively cooled by the fins.

In this case, each of the plurality of semiconductor element groups preferably includes a first diode element and a second diode element provided between a connection point between the first semiconductor switching element and the second semiconductor switching element and a connection point between the third semiconductor switching element and the fourth semiconductor switching element and connected in series to each other, in each of the plurality of semiconductor element groups, the second semiconductor switching element, one of the first semiconductor switching element and the fourth semiconductor switching element, and the first diode element are preferably disposed in a row along the first direction, and the third semiconductor switching element, the other of the first semiconductor switching element and the fourth semiconductor switching element, and the second diode element are preferably disposed in a row along the first direction. According to this structure, the number of switching elements for each row is equalized (three switching elements are disposed in each row), and thus as compared with the case in which either a set of the second semiconductor switching element and one of the first semiconductor switching element and the fourth semiconductor switching element or a set of the third semiconductor switching element and the other of the first semiconductor switching element and the fourth semiconductor switching element and both of the first diode element and the second diode element are disposed in a row along the first direction (the direction in which the fins extend) (the case in which four switching elements are disposed in a row), the temperature of one element (of the second semiconductor switching element and the third semiconductor switching element) described above can be more effectively cooled by the fins.

The aforementioned power converter in which each of the plurality of semiconductor element groups includes the first diode element and the second diode element preferably further includes a power converter main body including the plurality of semiconductor element groups, the power converter main body is preferably used for a railroad vehicle, the plurality of plate-shaped fins of the coolers preferably extends along the first direction, which is a traveling direction of the railroad vehicle, in each of the plurality of semiconductor element groups, the second semiconductor switching element is preferably disposed between the first diode element and one of the first semiconductor switching element and the fourth semiconductor switching element in the first direction, and the third semiconductor switching element is preferably disposed between the second diode element and the other of the first semiconductor switching element and the fourth semiconductor switching element in the first direction.

Here, in general, the traveling direction of a railroad vehicle is reversed between a forward route and a return route. Therefore, when the second semiconductor switching element and the third semiconductor switching element are respectively provided at ends of the rows (that extend along the first direction), the second semiconductor switching element and the third semiconductor switching element are located at the last stages of the rows depending on the traveling direction of the railroad vehicle. In this case, the second semiconductor switching element and the third semiconductor switching element are cooled by the cooling air, the temperature of which has been increased by cooling the two elements at the preceding stages of the rows in which the second semiconductor switching element and the third semiconductor switching element are disposed, and thus the second semiconductor switching element and the third semiconductor switching element may be insufficiently cooled in some cases. Therefore, the second semiconductor switching element is disposed between the first diode element and one of the first semiconductor switching element and the fourth semiconductor switching element, and the third semiconductor switching element is disposed between the second diode element and the other of the first semiconductor switching element and the fourth semiconductor switching element such that the second semiconductor switching element and the third semiconductor switching element are disposed at the middle stages of the rows in which the second semiconductor switching element and the third semiconductor switching element are disposed, regardless of the traveling direction of the railroad vehicle. Thus, the second semiconductor switching element and the third semiconductor switching element are not disposed at the last stages of the rows in which the second semiconductor switching element and the third semiconductor switching element are disposed, and thus the maximum values of the temperatures of the second semiconductor switching element and the third semiconductor switching element can be made relatively small.

In the aforementioned power converter according to the first aspect, the plurality of semiconductor element groups preferably includes a first semiconductor element group of a converter that converts an alternating current to a direct current and a second semiconductor element group of an inverter that converts a direct current to an alternating current, and at least in the first semiconductor element group, the second semiconductor switching element and the third semiconductor switching element are preferably shifted from each other in the second direction such that at least the portion of the fins with which the second semiconductor switching element overlaps as viewed in the direction orthogonal to the surfaces of the coolers is different from the fins with which the third semiconductor switching element overlaps as viewed in the direction orthogonal to the surfaces of the coolers. According to this structure, an increase in the temperature of each of the second semiconductor switching element and the third semiconductor switching element of at least the first semiconductor element group can be significantly reduced or prevented.

When the operating time of the converter is longer than that of the inverter, in the first semiconductor element group of the converter, shifting the second semiconductor switching element and the third semiconductor switching element from each other as described above is particularly effective for significantly reducing or preventing an increase in the temperature of each of the second semiconductor switching element and the third semiconductor switching element.

In the aforementioned power converter according to the first aspect, the coolers each preferably include a base to which the plurality of plate-shaped fins is attached, the power converter preferably further includes a plurality of fasteners by which the first semiconductor switching element, the second semiconductor switching element, the third semiconductor switching element, and the fourth semiconductor switching element are attached to each of the coolers, and a heat pipe provided inside the base of each of the coolers and that extends along the first direction, and the plurality of fasteners is preferably disposed side by side along the first direction, which is a direction in which the heat pipe extends. According to this structure, the heat pipe extends along a direction in which the plurality of fasteners is disposed side by side, and thus interference between the fasteners and the heat pipe inside the base can be significantly reduced or prevented.

In this case, the first semiconductor switching element, the second semiconductor switching element, the third semiconductor switching element, and the fourth semiconductor switching element are preferably respectively housed in modules each having a substantially rectangular shape as viewed in the direction orthogonal to the surfaces of the coolers, and the fasteners are preferably provided along two sides of each of the modules, each of which has a substantially rectangular shape, along the first direction. According to this structure, the fasteners are provided in parallel to each other along the two sides of each of the modules as viewed in the direction orthogonal to the surfaces of the coolers, and thus the heat pipe can be easily disposed between the fasteners provided on the aforementioned two sides.

In the aforementioned power converter according to the first aspect, the second semiconductor switching element and the third semiconductor switching element are preferably placed on the surfaces of the coolers such that the fins with which the second semiconductor switching element overlaps as viewed in the direction orthogonal to the surfaces of the coolers are different from the fins with which the third semiconductor switching element overlaps as viewed in the direction orthogonal to the surfaces of the coolers. According to this structure, as compared with the case in which both the second semiconductor switching element and the third semiconductor switching element are cooled by only the common fins, an increase in the temperature of each of the second semiconductor switching element and the third semiconductor switching element can be more effectively and significantly reduced or prevented.

A power converter for a railroad vehicle according to a second aspect of the present invention includes a plurality of semiconductor element groups each including a first semiconductor switching element, a second semiconductor switching element, a third semiconductor switching element, and a fourth semiconductor switching element connected in series to each other in this order, and coolers on which the plurality of semiconductor element groups is placed, including a plurality of plate-shaped fins that extends along a first direction, which is a traveling direction of the railroad vehicle. The plurality of plate-shaped fins is disposed side by side along a second direction orthogonal to the first direction, the plurality of semiconductor element groups is disposed side by side along the second direction so as to overlap with the fins on surfaces of the coolers opposite to surfaces on which the fins are provided, and in each of the plurality of semiconductor element groups, the second semiconductor switching element and the third semiconductor switching element are shifted from each other in the second direction such that at least a portion of the fins with which the second semiconductor switching element overlaps as viewed in a direction orthogonal to the surfaces of the coolers is different from the fins with which the third semiconductor switching element overlaps as viewed in the direction orthogonal to the surfaces of the coolers.

In the power converter for a railroad vehicle according to the second aspect of the present invention, as described above, the second semiconductor switching element and the third semiconductor switching element are shifted from each other in the second direction such that the second semiconductor switching element and the third semiconductor switching element can be cooled by the different fins using the cooling air generated by traveling of the railroad vehicle and that flows in the first direction. Thus, as compared with the case in which both the second semiconductor switching element and the third semiconductor switching element are cooled by only the common fins, an increase in the temperature of each of the second semiconductor switching element and the third semiconductor switching element can be significantly reduced or prevented. Consequently, failures caused by insufficient heat radiation (of the second semiconductor switching element and the third semiconductor switching element) can be significantly reduced or prevented. Consequently, failures of the railroad vehicle due to the power converter can be significantly reduced or prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram illustrating an arrangement of semiconductor elements in a semiconductor element group of a power converter according to a first modified example of the embodiment;

FIG. 6 is a diagram illustrating an arrangement of semiconductor elements in a semiconductor element group of a power converter according to a second modified example of the embodiment;

FIG. 7 is a diagram illustrating an arrangement of semiconductor elements in a semiconductor element group of a power converter according to a third modified example of the embodiment;

FIG. 8 is a diagram illustrating an arrangement of semiconductor elements in a semiconductor element group of a power converter according to a fourth modified example of the embodiment;

FIG. 9 is a diagram illustrating an arrangement of semiconductor elements in a semiconductor element group of a power converter according to a fifth modified example of the embodiment;

FIG. 10 is a diagram illustrating an arrangement of semiconductor elements in a semiconductor element group of a power converter according to a sixth modified example of the embodiment;

DESCRIPTION OF THE PREFERRED EMBODIMENTS

Embodiments of the present invention are hereinafter described with reference to the drawings.

[Present Embodiment]

The structure of a power converter 100 according to the present embodiment is now described with reference to FIGS. 1A to 4, 13A, and 13B. In the present embodiment, the term "plan view" denotes a state viewed in a direction (direction Z) orthogonal to surfaces 61a of coolers 60.

(Structure of High-Speed Railroad Vehicle)

Figure 1A:
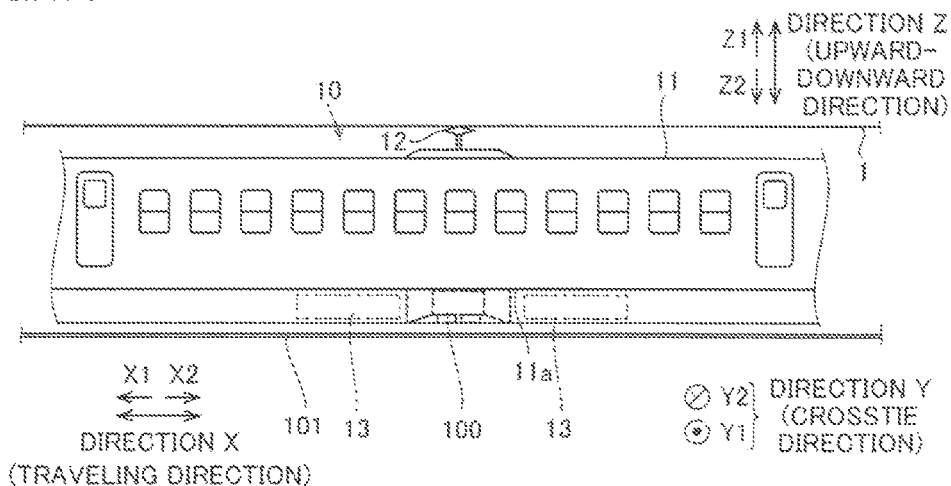
FIG. 1A is a schematic side view of a high-speed railroad vehicle according to an embodiment.

First, the structure of a high-speed railroad vehicle 10 on which a power converter 100 is installed is described with reference to FIGS. 1A and 1B. The power converter 100 is an example of a "power converter for a railroad vehicle" in the claims.

The high-speed railroad vehicle 10 is a high-speed railroad vehicle that travels at a speed of 180 km/h or more, for example, in a state in which a plurality of vehicles is coupled to each other. As shown in FIG. 1A, the high-speed railroad vehicle 10 travels with electric power supplied from an overhead wire 1 as an AC power supply. In the present embodiment, the case in which the high-speed railroad vehicle 10 travels in a direction X1 of a traveling direction (direction X) is described. In addition, the direction X1 of the traveling direction in which the high-speed railroad vehicle 10 travels is defined as the front side in the traveling direction, and a direction X2 opposite to the front side is defined as the rear side in the traveling direction. The high-speed railroad vehicle 10 and the traveling direction are examples of a "railroad vehicle" and a "first direction" in the claims, respectively.

The high-speed railroad vehicle 10 includes a vehicle body 11, a pantograph 12, the power converter 100, induction motors 130 (see FIG. 2B), and electric devices 13 such as an air conditioner (not shown). The high-speed railroad vehicle 10 travels on rails 101.

The pantograph 12 has a function of receiving electric power from the overhead wire 1. The power converter 100 converts an AC voltage from the pantograph 12 transformed by a transformer 102 (see FIG. 2B) to a desired three-phase AC voltage and frequency via a converter 310 (see FIG. 2B) and an inverter 311 (see FIG. 2B) of a power conversion unit 31 (see FIG. 2A) described below. The three-phase AC voltage and the frequency are output to the induction motors 130.

Figure 1B:
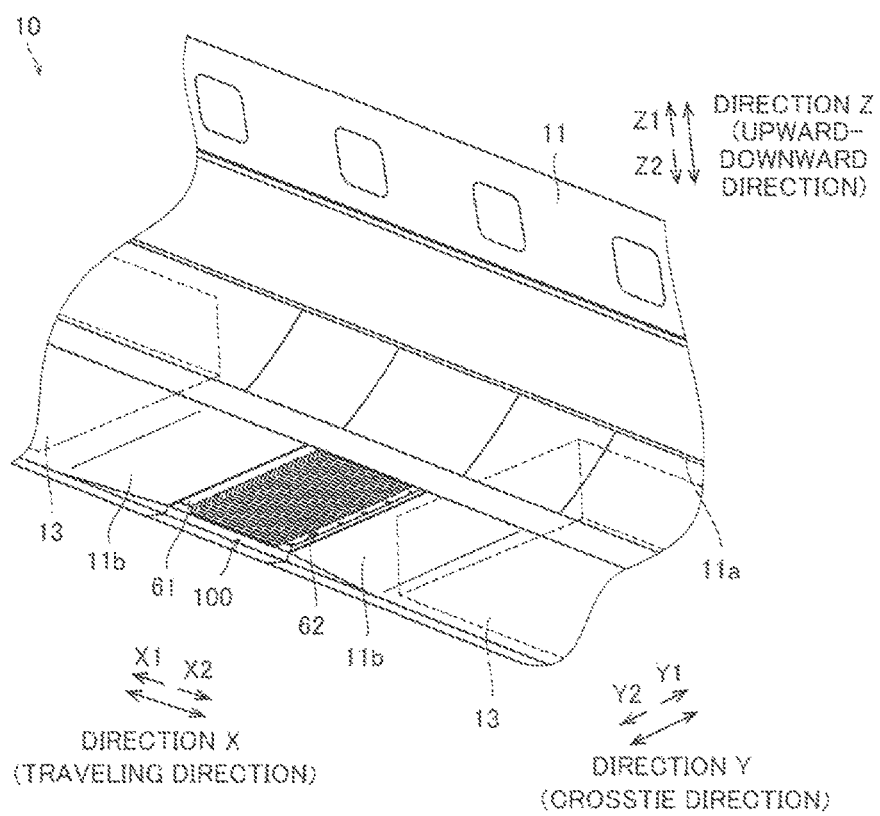
FIG. 1B is a schematic perspective view of the high-speed railroad vehicle according to the embodiment as viewed from below.

As shown in FIG. 1B, the power converter 100 is attached in a suspended state to a bottom portion 11a of the vehicle body 11. That is, the power converter 100 is attached below (direction Z2) the bottom portion 11a of the vehicle body 11 of the high-speed railroad vehicle 10. In the bottom portion 11a of the vehicle body 11 of the high-speed railroad vehicle 10, air intakes 11b are provided on the traveling direction side (direction X1) and on the side (direction X2) opposite to the traveling direction side with respect to radiation fins 62 described below.

(Structure of Power Converter)

Figure 2A:
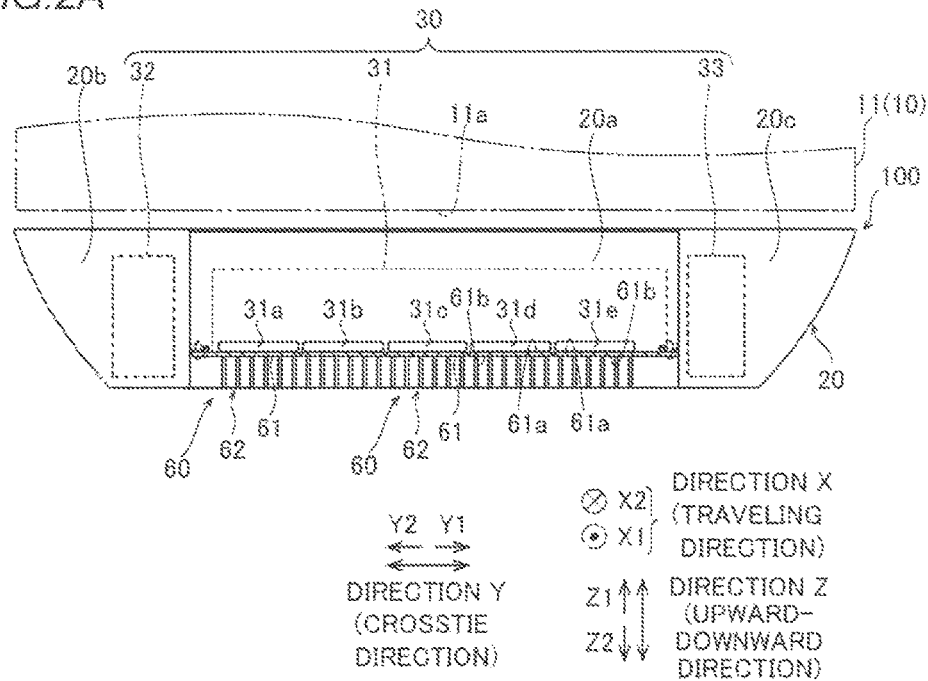
FIG. 2A is a schematic sectional view of a power converter according to the embodiment as viewed from the front side in a traveling direction.

As shown in FIG. 2A, the power converter 100 includes a housing 20 made of metal and a power converter main body 30 (see FIG. 2A) disposed inside the housing 20.

The housing 20 is divided into three device rooms 20a, 20b, and 20c. The device room 20a is located at the center of the housing 20 in a crosstie direction (direction Y). The device room 20b is located on one side (Y2 direction side) of the housing 20 in the crosstie direction. The device room 20c is located on the other side (Y1 direction side) of the housing 20 in the crosstie direction. The crosstie direction is an example of a "second direction" in the claims.

The power converter main body 30 includes a power conversion unit 31 disposed in the device room 20a, a controller 32 disposed in the device room 20b, and an electric device group 33 disposed in the device room 20c.

The power conversion unit 31 has a function of converting an AC voltage from the pantograph 12 (see FIGS. 1A and 1B) to a desired three-phase AC voltage and frequency. The power conversion unit 31 includes five semiconductor element groups 31a to 31e. The semiconductor element groups 31a to 31e are disposed side by side along the crosstie direction (direction Y). Specifically, the semiconductor element group 31a, the semiconductor element group 31b, the semiconductor element group 31c, the semiconductor element group 31d, and the semiconductor element group 31e are aligned in this order from the Y1 direction side to the Y2 direction side. The semiconductor element groups 31a to 31e generate heat during switching, for example.

The coolers 60 that radiate the heat of the semiconductor element groups 31a to 31e are provided below (direction Z2) the power conversion unit 31. Specifically, a plurality of (five in the present embodiment) coolers 60 respectively corresponding to the semiconductor element groups 31a to 31e is provided. That is, one of the semiconductor element groups 31a to 31e is placed on each of the plurality of coolers 60. The coolers 60 each include a heat receiver 61 and a plurality of plate-shaped radiation fins 62. The heat receiver 61 and the radiation fins 62 are examples of a "base" and a "fin" in the claims, respectively.

The heat receiver 61 has a plate shape. On a surface 61a of the heat receiver 61 on one side (upper side, Z1 direction side), a semiconductor element group (one of semiconductor element groups 31a to 31e) is placed. On a surface 61b of the heat receiver 61 on the other side (lower side opposite to the surface 61a, Z2 direction side), the plurality of radiation fins 62 is provided. The heat receiver 61 transmits the heat of the semiconductor element groups 31a to 31e to the plurality of radiation fins 62.

The plurality of radiation fins 62 is exposed to the outside in a lower portion of the housing 20 (see FIG. 1B). Thus, traveling air generated by traveling of the high-speed railroad vehicle 10 passes around the radiation fins 62 when the high-speed railroad vehicle 10 travels. That is, the traveling air flows in the traveling direction (direction X). The plurality of radiation fins 62 is cooled by the traveling air to radiate the heat of the semiconductor element groups 31a to 31e transmitted via the heat receiver 61. In addition, the plurality of radiation fins 62 is aligned at a constant pitch along the crosstie direction (direction Y) orthogonal to the traveling direction (direction X). The traveling air is an example of "cooling air" in the claims.

The radiation fins 62 protrude downward (direction Z2) from the surface 61b of the heat receiver 61 on the other side. Furthermore, the radiation fins 62 extend along the traveling direction (direction X), which is a direction in which the traveling air flows.

Figure 2B:
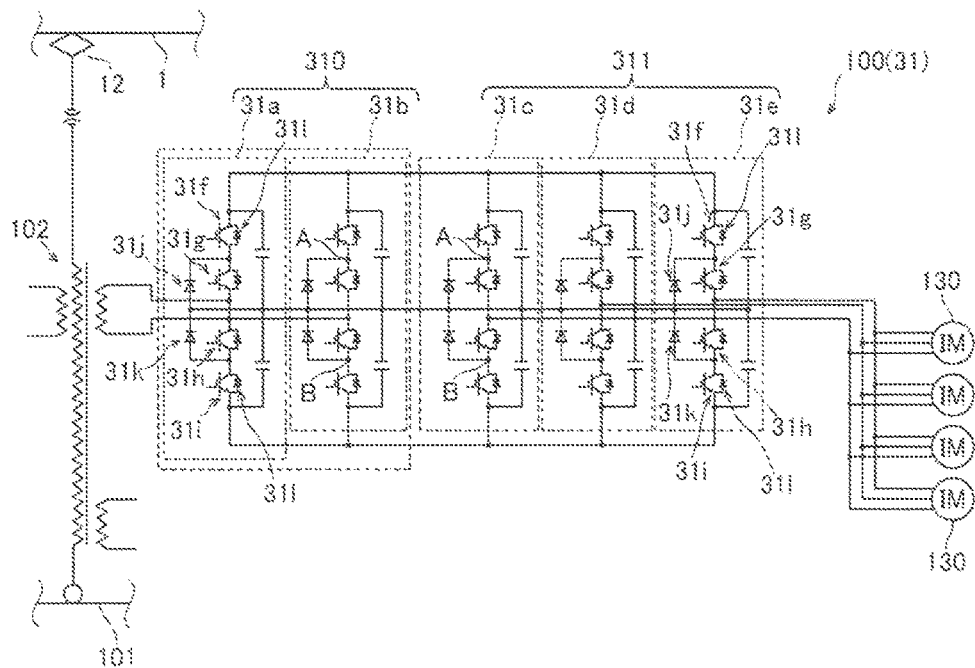
FIG. 2B is a diagram showing the configuration of a circuit of the power converter according to the embodiment.

As shown in FIG. 2B, the power conversion unit 31 includes the converter 310 that converts an alternating current to a direct current and the inverter 311 that converts a direct current to an alternating current. The converter 310 includes semiconductor element groups 31a and 31b. The inverter 311 includes semiconductor element groups 31c to 31e. The semiconductor element groups 31a and 31b are examples of a "first semiconductor element group" in the claims. The semiconductor element groups 31c to 31e are examples of a "second semiconductor element group" in the claims.

Each of the semiconductor element groups 31a to 31e includes a first semiconductor switching element 31f, a second semiconductor switching element 31g, a third semiconductor switching element 31h, and a fourth semiconductor switching element 31i connected in series to each other in this order. Each of the semiconductor element groups 31a to 31e further includes a first diode element 31j and a second diode element 31k connected in series to each other. The first diode element 31j is connected to a connection point A between the first semiconductor switching element 31f and the second semiconductor switching element 31g. The second diode element 31k is connected to a connection point B between the third semiconductor switching element 31h and the fourth semiconductor switching element 31i.

It should be noted that when the high-speed railroad vehicle 10 is in powering operation, the loss (see FIG. 13A) of the switching elements of the converter 310 is relatively larger when the high-speed railroad vehicle 10 moves at a high speed than when the high-speed railroad vehicle 10 moves at a low speed. In addition, the loss (see FIG. 13B) of the switching elements of the inverter 311 is relatively larger when the high-speed railroad vehicle 10 moves at a low speed than when the high-speed railroad vehicle 10 moves at a high speed. This is the same even when the high-speed railroad vehicle 10 is braking.

The time during which the high-speed railroad vehicle 10 is in powering operation is much longer than the time during the high-speed railroad vehicle 10 is braking. Furthermore, the time during which the high-speed railroad vehicle 10 is in powering operation at a high speed at which the loss of the switching elements of the converter 310 is increased is much longer than the time during the high-speed railroad vehicle 10 is in powering operation at a low speed at which the loss of the switching elements of the inverter 311 is increased. When the high-speed railroad vehicle 10 is in powering operation at a high speed, in the converter 310, assuming that the loss percentage of the second semiconductor switching element 31g and the third semiconductor switching element 31h is 100%, the loss percentage of the first semiconductor switching element 31f and the fourth semiconductor switching element 31i is about 50%. Furthermore, the loss percentage of the first diode element 31j and the second diode element 31k is about 20%. Therefore, among the switching elements of the converter 310 and the inverter 311, the second semiconductor switching element 31g and the third semiconductor switching element 31h of the converter 310 have the highest temperature rise.

Figure 3:
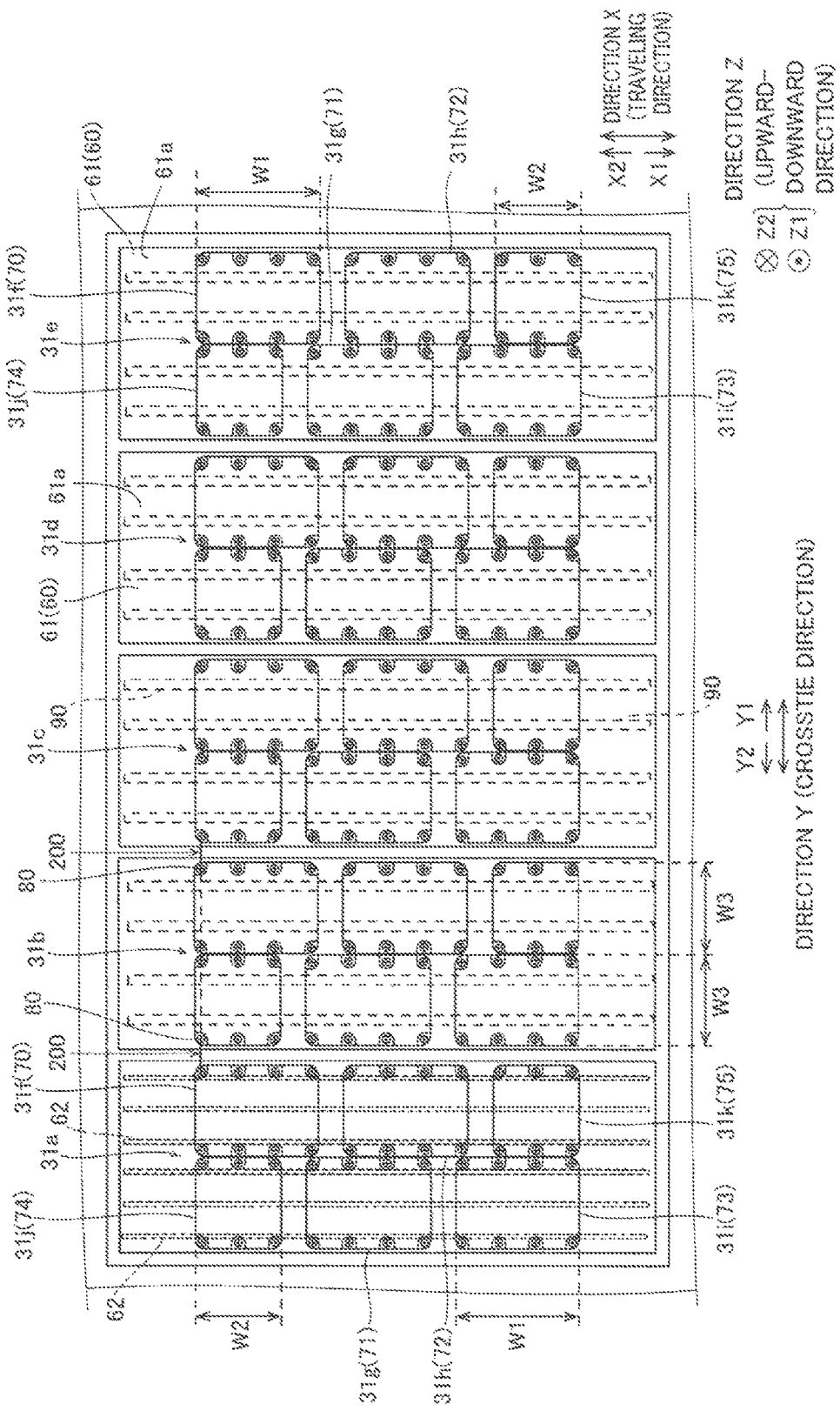
FIG. 3 is a diagram illustrating an arrangement of semiconductor elements of the power converter according to the embodiment.

According to the present embodiment, as shown in FIG. 3, in each of the plurality of semiconductor element groups 31a to 31e, the second semiconductor switching element 31g and the third semiconductor switching element 31h are shifted from each other in the crosstie direction (direction Y) such that the radiation fins 62 with which the second semiconductor switching element 31g overlaps in the planar view are different from the radiation fins 62 with which the third semiconductor switching element 31h overlaps in the planar view. Specifically, a module 71 (described below) that houses the second semiconductor switching element 31g and a module 72 (described below) that houses the third semiconductor switching element 31h are aligned side by side so as to be adjacent to each other in the direction Y. The module 71 is disposed on the Y2 direction side, and the module 72 is disposed on the Y1 direction side.

Specifically, six radiation fins 62 are disposed below each of the plurality of semiconductor element groups 31a to 31e. Three radiation fins 62 on the Y2 direction side are disposed below the second semiconductor switching element 31g, and three radiation fins 62 on the Y1 direction side are disposed below the third semiconductor switching element 31h. In FIG. 3, the radiation fins 62 disposed below the semiconductor element group 31a are only illustrated for the sake of simplicity.

According to the present embodiment, in each of the plurality of semiconductor element groups 31a to 31e, the second semiconductor switching element 31g and the fourth semiconductor switching element 31i are disposed in a row along the traveling direction (direction X). In addition, the third semiconductor switching element 31h and the first semiconductor switching element 31f are disposed in a row along the traveling direction (direction X).

According to the present embodiment, in each of the plurality of semiconductor element groups 31a to 31e, the second semiconductor switching element 31g, the fourth semiconductor switching element 31i, and the first diode element 31j are disposed in a row along the traveling direction (direction X). In addition, the third semiconductor switching element 31h, the first semiconductor switching element 31f, and the second diode element 31k are disposed in a row along the traveling direction (direction X).

According to the present embodiment, in each of the plurality of semiconductor element groups 31a to 31e, the second semiconductor switching element 31g is disposed between the fourth semiconductor switching element 31i and the first diode element 31j in the traveling direction (direction X). In addition, the third semiconductor switching element 31*h* is disposed between the first semiconductor switching element 31*f* and the second diode element 31*k*.

Specifically, the fourth semiconductor switching element 31*i* is disposed on the X1 direction side of the second semiconductor switching element 31*g*. The first semiconductor switching element 31*f* is disposed on the X2 direction side of the third semiconductor switching element 31*h*. The first diode element 31*j* is disposed on the X2 direction side of the second semiconductor switching element 31*g*. The second diode element 31*k* is disposed on the X1 direction side of the third semiconductor switching element 31*h*.

In each of the semiconductor element groups 31*a* to 31*e*, the first semiconductor switching element 31*f*, the second semiconductor switching element 31*g*, the third semiconductor switching element 31*h*, the fourth semiconductor switching element 31*i*, the first diode element 31*j*, and the second diode element 31*k* are respectively housed in modules 70 to 75 each having a substantially rectangular shape in the planar view. In addition to the semiconductor switching elements (31*f* to 31*i*), diode elements 311 (see FIG. 2B) connected in parallel to the semiconductor switching elements (31*f* to 31*i*) are respectively housed in the modules 70 to 73.

The module 70 that houses the first semiconductor switching element 31*f* and the module 74 that houses the first diode element 31*j* are disposed by side by side so as to be adjacent to each other in the direction Y. The module 70 is disposed on the Y1 direction side, and the module 74 is disposed on the Y2 direction side. In addition, the module 73 that houses the fourth semiconductor switching element 31*i* and the module 75 that houses the second diode element 31*k* are disposed side by side so as to be adjacent to each other in the direction Y. The module 75 is disposed on the Y1 direction side, and the module 73 is disposed on the Y2 direction side.

In the plan view, the side of the module 70 in the direction X2 is flush with the side of the module 74 in the direction X2. Furthermore, in the plan view, the side of the module 73 in the direction X1 is flush with the side of the module 75 in the direction X1. In the plan view, the sides of the module 71, the module 73, and the module 74 in a direction Y2 are flush with each other. In the plan view, the sides of the module 70, the module 72, and the module 75 in a direction Y1 are flush with each other.

In the plan view, an end of the module 70 on the X1 direction side protrudes in the direction X1 beyond the side of the module 74 in the direction X1. Furthermore, in the plan view, an end of the module 71 on the X2 direction side protrudes in the direction X2 beyond the side of the module 72 in the direction X2, and an end of the module 72 on the X1 direction side protrudes in the direction X1 beyond the side of the module 71 in the direction X1. Moreover, in the plan view, an end of the module 73 on the X2 direction side protrudes in the direction X2 beyond the side of the module 75 in the direction X2.

In the crosstie direction (direction Y), the module 71 and the module 72 contact each other, the module 70 and the module 74 contact each other, and the module 73 and the module 75 contact each other. In the traveling direction (direction X), the module 71, the module 73, and the module 74 are spaced apart from each other. Furthermore, in the traveling direction (direction X), the module 70, the module 72, and the module 75 are spaced apart from each other.

The width W1 of each of the modules 70 to 73 in the direction X is larger than the width W2 of each of the modules 74 and 75 in the direction X. The width of each of the modules 70 to 75 in the direction Y is a width W3. The width W3 is smaller than the width W1.

Figure 4:
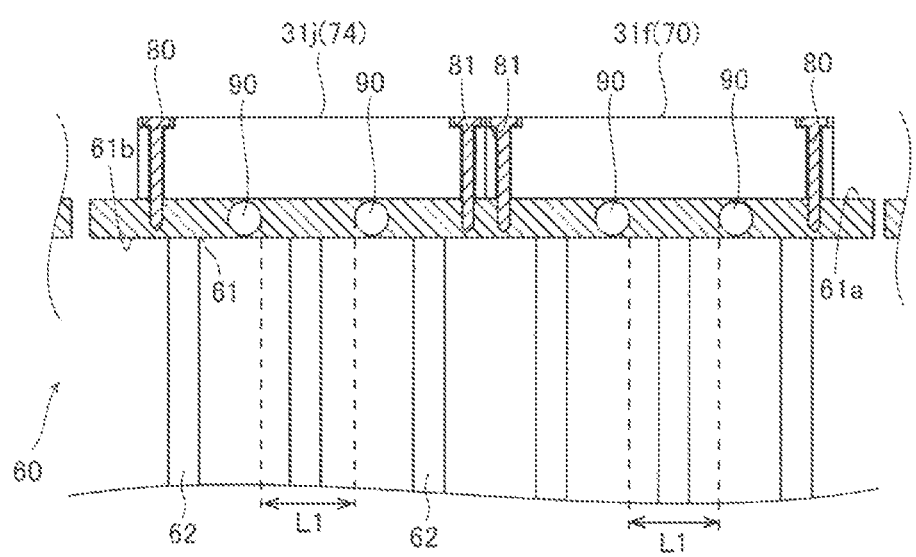
FIG. 4 is a sectional view taken along the line 200-200 in FIG. 3.

As shown in FIGS. 3 and 4, the power converter 100 includes a plurality of screws 80 by which the first semiconductor switching element 31*f*, the second semiconductor switching element 31*g*, the third semiconductor switching element 31*h*, the fourth semiconductor switching element 31*i*, the first diode element 31*j*, and the second diode element 31*k* are attached to each of the coolers 60. The screws 80 are examples of a "fastener" in the claims.

Specifically, each of the modules 70 to 75 includes a plurality of insertion holes 81 (see FIG. 4) into which the screws 80 are inserted. The screws 80 are inserted into the surface 61*a* of the heat receiver 61 through the insertion holes 81, and the modules 70 to 75 are fixed to the surface 61*a*.

The power converter 100 (see FIGS. 1A and 1B) includes a plurality of heat pipes 90. The heat pipes 90 have a function of making the temperature of the heat receiver 61 uniform. The plurality of heat pipes 90 extends along the traveling direction (direction X), and is provided inside the heat receivers 61 of the coolers 60. Specifically, four heat pipes 90 are provided for one heat receiver 61. In FIG. 3, the heat pipes 90 provided in the heat receiver 61 corresponding to the semiconductor element group 31*a* are not illustrated for the sake of simplicity, but actually, in the heat receiver 61 corresponding to the semiconductor element group 31*a*, the heat pipes 90 are provided similarly to the semiconductor element groups 31*b* to 31*e*.

The heat pipes 90 extend from the vicinity of an end of the heat receiver 61 on the X1 direction side to the vicinity of an end of the heat receiver 61 on the X2 direction side.

According to the present embodiment, the plurality of screws 80 is aligned along the traveling direction (direction X), which is a direction in which the heat pipes 90 extend. That is, the direction in which the heat pipes 90 extend is substantially parallel to a direction in which the plurality of screws 80 is aligned.

Specifically, the screws 80 are provided along the two sides of each of the modules 70 to 75, each of which has a substantially rectangular shape, along the traveling direction (direction X). That is, in the plan view, the screws 80 are provided along each of the side in the direction Y1 and the side in the direction Y2. The screws 80 provided on the side of each of the module 71, the module 73, and the module 74 in the direction Y1 (direction Y2) are substantially linearly disposed. Furthermore, the screws 80 provided on the side of each of the module 70, the module 72, and the module 75 in the direction Y1 (direction Y2) are substantially linearly disposed. In each of the modules 70 to 73, four screws 80 are provided on each of the side in the direction Y1 and the side in the direction Y2. In each of the modules 74 and 75, three screws 80 are provided on each of the side in the direction Y1 and the side in the direction Y2.

In the plan view, two heat pipes 90 are disposed between the screws 80 provided on the sides of each of the modules 70 to 75 in the directions Y1 and Y2. These two heat pipes 90 are spaced apart from each other by a length L1 (see FIG. 4) in the direction Y.

(Advantageous Effects of Present Embodiment)

According to the present embodiment, the following advantageous effects are achieved.

According to the present embodiment, as described above, the plurality of semiconductor element groups 31*a* to 31*e* is disposed side by side along the crosstie direction (direction Y) so as to overlap with the radiation fins 62 on the surfaces 61*a* of the coolers 60 opposite to the surfaces 61b on which the radiation fins 62 are provided. Furthermore, in each of the plurality of semiconductor element groups 31a to 31e of the power converter 100, the second semiconductor switching element 31g and the third semiconductor switching element 31h are shifted from each other in the crosstie direction (direction Y) such that the radiation fins 62 with which the second semiconductor switching element 31g overlaps in the plan view are different from the radiation fins 62 with which the third semiconductor switching element 31h overlaps in the plan view.

Here, each of the second semiconductor switching element 31g and the third semiconductor switching element 31h is more frequently switched than the first semiconductor switching element 31f and the fourth semiconductor switching element 31i, and thus the second semiconductor switching element 31g and the third semiconductor switching element 31h generate a relatively large amount of heat due to an increase in the switching loss. Therefore, the second semiconductor switching element 31g and the third semiconductor switching element 31h are shifted from each other in the crosstie direction (direction Y) such that the second semiconductor switching element 31g and the third semiconductor switching element 31h can be cooled by the different radiation fins 62 using the traveling air generated by traveling of the high-speed railroad vehicle 10 and that flows in the traveling direction (direction X). Thus, unlike the case in which both the second semiconductor switching element 31g and the third semiconductor switching element 31h are cooled by only the common radiation fins 62, an increase in the temperature of each of the second semiconductor switching element 31g and the third semiconductor switching element 31h can be significantly reduced or prevented. Consequently, failures caused by insufficient heat radiation (of the second semiconductor switching element 31g and the third semiconductor switching element 31h) can be significantly reduced or prevented. Consequently, failures of the high-speed railroad vehicle 10 due to the power converter 100 can be significantly reduced or prevented.

The plurality of semiconductor element groups 31a to 31e is disposed side by side along the crosstie direction (direction Y) such that unlike the case in which the plurality of semiconductor element groups 31a to 31e is disposed side by side along the traveling direction (direction X), the second semiconductor switching element 31g and the third semiconductor switching element 31h are not disposed side by side along the traveling direction (direction X). Consequently, unlike the case in which the plurality of semiconductor element groups 31a to 31e is disposed side by side along the traveling direction (direction X), heat interference between the second semiconductor switching elements 31g or heat interference between the third semiconductor switching elements 31h can be reduced, and thus an increase in the temperature of each of the second semiconductor switching element 31g and the third semiconductor switching element 31h can be further significantly reduced or prevented.

According to the present embodiment, as described above, in each of the plurality of semiconductor element groups 31a to 31e of the power converter 100, the second semiconductor switching element 31g and the fourth semiconductor switching element 31i are disposed in a row along the traveling direction (direction X), and the third semiconductor switching element 31h and the first semiconductor switching element 31f are disposed in a row along the traveling direction (direction X). Thus, the two switching elements are disposed in a row along the traveling direction (direction X), and thus as compared with the case in which one of the second semiconductor switching element 31g and the third semiconductor switching element 31h and both of the first semiconductor switching element 31f and the fourth semiconductor switching element 31i are disposed in a row along the traveling direction (direction X) (the case in which three switching elements are disposed in a row), the temperature of one element (of the second semiconductor switching element 31g and the third semiconductor switching element 31h) described above can be effectively cooled by the radiation fins 62.

According to the present embodiment, as described above, in each of the plurality of semiconductor element groups 31a to 31e of the power converter 100, the second semiconductor switching element 31g, the fourth semiconductor switching element 31i, and the first diode element 31j are disposed in a row along the traveling direction (direction X), and the third semiconductor switching element 31h, the first semiconductor switching element 31f, and the second diode element 31k are disposed in a row along the traveling direction (direction X). Thus, the number of switching elements for each row is equalized (three switching elements are disposed in each row), and thus as compared with the case in which one of a set of the second semiconductor switching element 31g and the fourth semiconductor switching element 31i and a set of the third semiconductor switching element 31h and the first semiconductor switching element 31f and both of the first diode element 31j and the second diode element 31k are disposed in a row along the traveling direction (direction X) (the case in which four switching elements are disposed in a row), the temperature of one element (of the second semiconductor switching element 31g and the third semiconductor switching element 31h) described above can be more effectively cooled by the radiation fins 62.

According to the present embodiment, as described above, in each of the plurality of semiconductor element groups 31a to 31e of the power converter 100, the second semiconductor switching element 31g is disposed between the fourth semiconductor switching element 31i and the first diode element 31j in the traveling direction (direction X), and the third semiconductor switching element 31h is disposed between the first semiconductor switching element 31f and the second diode element 31k in the traveling direction (direction X).

Here, in general, the traveling direction of a railroad vehicle is reversed between a forward route and a return route. Therefore, when the second semiconductor switching element 31g and the third semiconductor switching element 31h are respectively provided at ends of the rows (that extend along the traveling direction (direction X)), the second semiconductor switching element 31g and the third semiconductor switching element 31h are located at the last stages of the rows depending on the traveling direction of the railroad vehicle. In this case, the second semiconductor switching element 31g and the third semiconductor switching element 31h are cooled by cooling air, the temperature of which has been increased by cooling the two elements at the preceding stages of the rows in which the second semiconductor switching element 31g and the third semiconductor switching element 31h are disposed, and thus the second semiconductor switching element 31g and the third semiconductor switching element 31h may be insufficiently cooled in some cases. Therefore, the second semiconductor switching element 31g is disposed between the fourth semiconductor switching element 31i and the first diode element 31j, and the third semiconductor switching element 31h is disposed between the first semiconductor switching element 31f and the second diode element 31k such that the second semiconductor switching element 31g and the third semiconductor switching element 31h are disposed at the middle stages of the rows in which the second semiconductor switching element 31g and the third semiconductor switching element 31h are disposed, regardless of the traveling direction of the railroad vehicle. Thus, the second semiconductor switching element 31g and the third semiconductor switching element 31h are not disposed at the last stages of the rows in which the second semiconductor switching element 31g and the third semiconductor switching element 31h are disposed, and thus the maximum values of the temperatures of the second semiconductor switching element 31g and the third semiconductor switching element 31h can be made relatively small.

According to the present embodiment, as described above, in the first semiconductor element group (semiconductor element groups 31a and 31b) of the power converter 100, the second semiconductor switching element 31g and the third semiconductor switching element 31h are shifted from each other in the crosstie direction (direction Y) such that the radiation fins 62 with which the second semiconductor switching element 31g overlaps in the plan view are different from the radiation fins 62 with which the third semiconductor switching element 31h overlaps in the plan view. Thus, an increase in the temperature of each of the second semiconductor switching element 31g and the third semiconductor switching element 31h of the first semiconductor element group (semiconductor element groups 31a and 31b) can be significantly reduced or prevented.

Here, in the converter 310, the loss (heat generation) of the semiconductor elements is large when the high-speed railroad vehicle 10 moves at a high speed, and in the inverter 311, the loss (heat generation) of the semiconductor elements is large when the high-speed railroad vehicle 10 moves at a low speed (immediately after departure or immediately before stop). In addition, the high-speed railroad vehicle 10 moves at a high speed most of the time. Thus, in the first semiconductor element group (semiconductor element groups 31a and 31b) of the converter 310, shifting the second semiconductor switching element 31g and the third semiconductor switching element 31h from each other in the crosstie direction (direction Y) such that the radiation fins 62 with which the second semiconductor switching element 31g overlaps in the plan view (as viewed in the direction Z) are different from the radiation fins 62 with which the third semiconductor switching element 31h overlaps in the plan view (as viewed in the direction Z) is particularly effective for significantly reducing or preventing an increase in the temperature of each of the second semiconductor switching element 31g and the third semiconductor switching element 31h.

According to the present embodiment, as described above, the power converter 100 further includes the heat pipes 90 provided inside the heat receivers 61 of the coolers 60 and extending along the traveling direction (direction X), and the plurality of screws 80 is disposed side by side along the traveling direction (direction X), which is the direction in which the heat pipes 90 extend. Thus, the heat pipes 90 extend along the direction in which the plurality of screws 80 is disposed side by side, and thus interference between the screws 80 and the heat pipes 90 inside the heat receivers 61 can be significantly reduced or prevented.

According to the present embodiment, as described above, the first semiconductor switching element 31f, the second semiconductor switching element 31g, the third semiconductor switching element 31h, and the fourth semiconductor switching element 31i are respectively housed in the modules 70 to 73 each having a substantially rectangular shape in the plan view (as viewed in the direction Z). Furthermore, in the power converter 100, the screws 80 are provided along the two sides of each of the modules 70 to 73, each of which has a substantially rectangular shape, along the traveling direction (direction X). Thus, the screws 80 are provided in parallel to each other along the two sides of each of the modules 70 to 73 in the plan view (as viewed in the direction Z), and thus the heat pipes 90 can be easily disposed between the screws 80 provided on the aforementioned two sides.

MODIFIED EXAMPLES

The embodiments disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the fins (radiation fins 62) with which the second semiconductor switching element overlaps as viewed in the direction (direction Z) orthogonal to the surfaces (61a) of the coolers are different from the fins (radiation fins 62) with which the third semiconductor switching element overlaps as viewed in the direction (direction Z) orthogonal to the surfaces (61a) of the coolers in the aforementioned embodiment, the present invention is not restricted to this. For example, a portion of the fins (radiating fins 62) with which the second semiconductor switching element overlaps as viewed in the direction (direction Z) orthogonal to the surfaces (61a) of the coolers may alternatively be different from the fins (radiating fins 62) with which the third semiconductor switching element overlaps as viewed in the direction (direction Z) orthogonal to the surfaces (61a) of the coolers.

While the fourth semiconductor switching element (module 73) is disposed on the X1 direction side of the second semiconductor switching element (module 71), the first diode element (module 74) is disposed on the X2 direction side of the second semiconductor switching element (module 72), the second diode element (module 75) is disposed on the X1 direction side of the third semiconductor switching element (module 72), and the first semiconductor switching element (module 70) is disposed on the X2 direction side of the third semiconductor switching element (module 72) in the aforementioned embodiment, the present invention is not restricted to this.

For example, as shown in FIG. 5, the first semiconductor switching element 31f (module 70) may alternatively be disposed on the X1 direction side of the second semiconductor switching element 31g (module 71), the first diode element 31j (module 74) may alternatively be disposed on the X2 direction side of the second semiconductor switching element 31g (module 71), the second diode element 31k (module 75) may alternatively be disposed on the X1 direction side of the third semiconductor switching element 31h (module 72), and the fourth semiconductor switching element 31i (module 73) may alternatively be disposed on the X2 direction side of the third semiconductor switching element 31h (module 72). In this case, the second semiconductor switching element 31g (module 71) and the third semiconductor switching element 31h (module 72) are disposed adjacent to each other in the direction Y, the first diode element 31j (module 74) and the fourth semiconductor switching element 31i (module 73) are disposed adjacent to each other in the direction Y, and the first semiconductor switching element 31*f* (module 70) and the second diode element 31*k* (module 75) are disposed adjacent to each other in the direction Y. The second semiconductor switching element 31*g* (module 71) is disposed on the Y2 direction side of the third semiconductor switching element 31*h* (module 72).

As shown in FIG. 6, the first semiconductor switching element 31*f* (module 70) may alternatively be disposed on the X2 direction side of the second semiconductor switching element 31*g* (module 71), the first diode element 31*j* (module 74) may alternatively be disposed on the X2 direction side of the first semiconductor switching element 31*f* (module 70), the fourth semiconductor switching element 31*i* (module 73) may alternatively be disposed on the X2 direction side of the third semiconductor switching element 31*h* (module 72), and the second diode element 31*k* (module 75) may alternatively be disposed on the X2 direction side of the fourth semiconductor switching element 31*i* (module 73). In this case, the second semiconductor switching element 31*g* (module 71) and the third semiconductor switching element 31*h* (module 72) are disposed adjacent to each other in the direction Y, the first semiconductor switching element 31*f* (module 70) and the fourth semiconductor switching element 31*i* (module 73) are disposed adjacent to each other in the direction Y, and the first diode element 31*j* (module 74) and the second diode element 31*k* (module 75) are disposed adjacent to each other in the direction Y. The second semiconductor switching element 31*g* (module 71) is disposed on the Y2 direction side of the third semiconductor switching element 31*h* (module 72).

As shown in FIG. 7, the first diode element 31*j* (module 74) may alternatively be disposed on the X1 direction side of the second semiconductor switching element 31*g* (module 71), the first semiconductor switching element 31*f* (module 70) may alternatively be disposed on the X1 direction side of the first diode element 31*j* (module 74), the second diode element 31*k* (module 75) may alternatively be disposed on the X2 direction side of the third semiconductor switching element 31*h* (module 72), and the fourth semiconductor switching element 31*i* (module 73) may alternatively be disposed on the X2 direction side of the second diode element 31*k* (module 75). In this case, the second semiconductor switching element 31*g* (module 71) and the fourth semiconductor switching element 31*i* (module 73) are disposed adjacent to each other in the direction Y, the first diode element 31*j* (module 74) and the second diode element 31*k* (module 75) are disposed adjacent to each other in the direction Y, and the first semiconductor switching element 31*f* (module 70) and the third semiconductor switching element 31*h* (module 72) are disposed adjacent to each other in the direction Y. The second semiconductor switching element 31*g* (module 71) is disposed on the Y2 direction side of the third semiconductor switching element 31*h* (module 72).

As shown in FIG. 8, the first diode element 31*j* (module 74) may alternatively be disposed on the X1 direction side of the second semiconductor switching element 31*g* (module 71), the first semiconductor switching element 31*f* (module 70) may alternatively be disposed on the X1 direction side of the first diode element 31*j* (module 74), the second diode element 31*k* (module 75) may alternatively be disposed on the X1 direction side of the third semiconductor switching element 31*h* (module 72), and the fourth semiconductor switching element 31*i* (module 73) may alternatively be disposed on the X1 direction side of the second diode element 31*k* (module 75). In this case, the second semiconductor switching element 31*g* (module 71) and the third semiconductor switching element 31*h* (module 72) are disposed adjacent to each other in the direction Y, the first diode element 31*j* (module 74) and the second diode element 31*k* (module 75) are disposed adjacent to each other in the direction Y, and the first semiconductor switching element 31*f* (module 70) and the fourth semiconductor switching element 31*i* (module 73) are disposed adjacent to each other in the direction Y. The second semiconductor switching element 31*g* (module 71) is disposed on the Y2 direction side of the third semiconductor switching element 31*h* (module 72).

As shown in FIG. 9, the first semiconductor switching element 31*f* (module 70) may alternatively be disposed on the X1 direction side of the second semiconductor switching element 31*g* (module 71), the second diode element 31*k* (module 75) may alternatively be disposed on the X1 direction side of the first semiconductor switching element 31*f* (module 70), the fourth semiconductor switching element 31*i* (module 73) may alternatively be disposed on the X2 direction side of the third semiconductor switching element 31*h* (module 72), and the first diode element 31*j* (module 74) may alternatively be disposed on the X2 direction side of the fourth semiconductor switching element 31*i* (module 73). In this case, the second semiconductor switching element 31*g* (module 71) and the first diode element 31*j* (module 74) are disposed adjacent to each other in the direction Y, the first semiconductor switching element 31*f* (module 70) and the fourth semiconductor switching element 31*i* (module 73) are disposed adjacent to each other in the direction Y, and the second diode element 31*k* (module 75) and the third semiconductor switching element 31*h* (module 72) are disposed adjacent to each other in the direction Y. The second semiconductor switching element 31*g* (module 71) is disposed on the Y2 direction side of the third semiconductor switching element 31*h* (module 72).

As shown in FIG. 10, the second diode element 31*k* (module 75) may alternatively be disposed on the X2 direction side of the second semiconductor switching element 31*g* (module 71), the fourth semiconductor switching element 31*i* (module 73) may alternatively be disposed on the X2 direction side of the second diode element 31*k* (module 75), the first diode element 31*j* (module 74) may alternatively be disposed on the X1 direction side of the third semiconductor switching element 31*h* (module 72), and the first semiconductor switching element 31*f* (module 70) may alternatively be disposed on the X1 direction side of the first diode element 31*j* (module 74). In this case, the second semiconductor switching element 31*g* (module 71) and the first semiconductor switching element 31*f* (module 70) are disposed adjacent to each other in the direction Y, the first diode element 31*j* (module 74) and the second diode element 31*k* (module 75) are disposed adjacent to each other in the direction Y, and the third semiconductor switching element 31*h* (module 72) and the fourth semiconductor switching element 31*i* (module 73) are disposed adjacent to each other in the direction Y. The second semiconductor switching element 31*g* (module 71) is disposed on the Y1 direction side of the third semiconductor switching element 31*h* (module 72).

Figure 11:
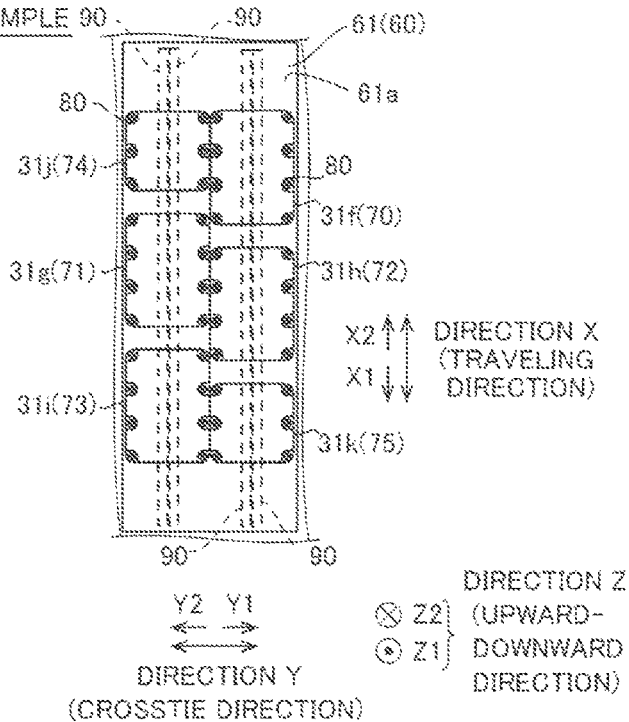
FIG. 11 is a diagram illustrating an arrangement of heat pipes in a semiconductor element group of a power converter according to a seventh modified example of the embodiment.
Figure 12:
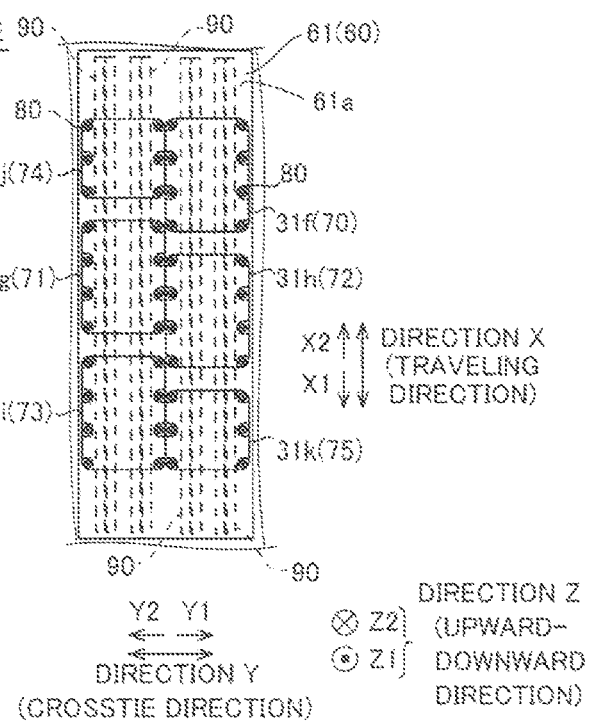
FIG. 12 is a diagram illustrating an arrangement of heat pipes in a semiconductor element group of a power converter according to an eighth modified example of the embodiment.
Figure 13A:
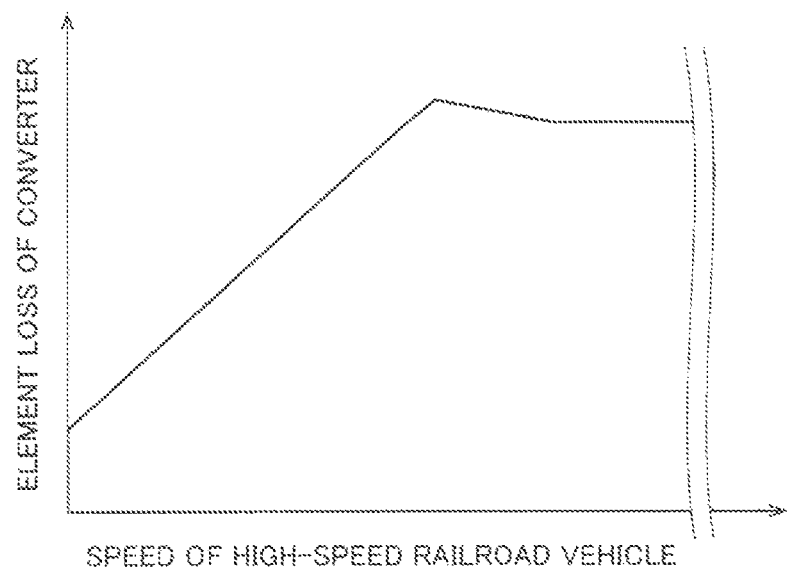
FIG. 13A is a graph showing the loss of a converter with respect to the speed of the railroad vehicle according to the embodiment.
Figure 13B:
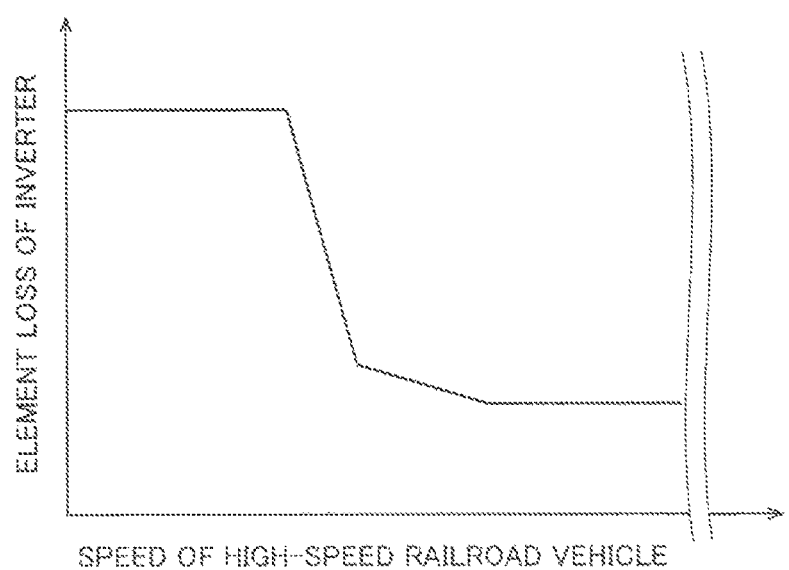
FIG. 13B is a graph showing the loss of an inverter with respect to the speed of the railroad vehicle according to the embodiment.

While the two heat pipes disposed between the fasteners (screws 80) provided on the side in the direction Y1 and the side in the direction Y2 in each of the plurality of modules (70 to 75) are spaced apart from each other in the direction Y in the aforementioned embodiment, the present invention is not restricted to this. As shown in FIG. 11, the aforementioned two heat pipes may not be spaced apart from each other in the direction Y. Furthermore, as shown in FIG. 12, two sets of two heat pipes not spaced apart from each other in the direction Y may alternatively be provided between fasteners (screws 80) provided on the side in the direction Y1 and the side in the direction Y2 in each of a plurality of modules (70 to 75).

While the power converter main body is used for the railroad vehicle in the aforementioned embodiment, the present invention is not restricted to this. The power converter main body may alternatively be used for other than the railroad vehicle. In this case, cooling air may be forcibly blown to the fins (radiation fins 62) by a device, for example.

While in each of the first semiconductor element group (semiconductor element groups 31a and 31b) of the converter and the second semiconductor element group (semiconductor element groups 31c to 31e) of the inverter, the second semiconductor switching element and the third semiconductor switching element are shifted from each other in the second direction (crosstie direction) such that the fins (radiation fins 62) with which the second semiconductor switching element overlaps as viewed in the direction orthogonal to the surfaces of the coolers are different from the fins (radiation fins 62) with which the third semiconductor switching element overlaps as viewed in the direction orthogonal to the surfaces of the coolers in the aforementioned embodiment, the present invention is not restricted to this. For example, the second semiconductor switching element and the third semiconductor switching element may alternatively be shifted from each other in the second direction (crosstie direction) only in the first semiconductor element group (semiconductor element groups 31a and 31b) of the converter.

While the two semiconductor element groups (31a and 31b) of the converter are disposed adjacently side by side, and the three semiconductor element groups (31c to 31e) of the inverter are disposed adjacently side by side in the aforementioned embodiment, the present invention is not restricted to this. For example, the semiconductor element groups of the converter and the semiconductor element groups of the inverter may alternatively be alternately disposed side by side in the second direction (crosstie direction).

While the plurality of coolers is respectively provided corresponding to the plurality of semiconductor element groups in the aforementioned embodiment, the present invention is not restricted to this. For example, a single cooler common to the plurality of semiconductor element groups (31a to 31e) may alternatively be provided. Furthermore, in each of the plurality of semiconductor element groups (31a to 31e), two coolers respectively corresponding to an element row including the second semiconductor switching element (that extends along the first direction) and an element row including the third semiconductor switching element (that extends along the first direction) may alternatively be provided.

While the six fins (radiation fins 62) are disposed below each of the plurality of semiconductor element groups in the aforementioned embodiment, the present invention is not restricted to this. A plurality of fins (radiation fins 62) other than six may alternatively be disposed below each of the plurality of semiconductor element groups.

While in the second direction (crosstie direction), the module 71 and the module 72 contact each other, the module 70 and the module 74 contact each other, and the module 73 and the module 75 contact each other in the aforementioned embodiment, the present invention is not restricted to this. In the second direction (crosstie direction), the module 71 and the module 72 may alternatively be spaced apart from each other, the module 70 and the module 74 may alternatively be spaced apart from each other, and the module 73 and the module 75 may alternatively be spaced apart from each other.

While in the first direction (traveling direction), the module 71, the module 73, and the module 74 are spaced apart from each other, and the module 70, the module 72, and the module 75 are spaced apart from each other in the aforementioned embodiment, the present invention is not restricted to this. In the first direction (traveling direction), the module 71, the module 73, and the module 74 may alternatively contact each other, and the module 70, the module 72, and the module 75 may alternatively contact each other.

While each of the plurality of modules has a substantially rectangular shape in the aforementioned embodiment, the present invention is not restricted to this. For example, each of the plurality of modules may alternatively have a shape other than a rectangular shape (circular shape, for example).

While in each of the plurality of semiconductor element groups, the two semiconductor elements are disposed adjacently side by side along the second direction (crosstie direction) in the aforementioned embodiment, the present invention is not restricted to this. For example, three or more semiconductor elements may alternatively be disposed adjacently side by side along the second direction (crosstie direction).

While in the cooler on which each of the plurality of semiconductor element groups is placed, the heat pipes extend from the vicinity of the end on the X1 direction side to the vicinity of the end on the X2 direction side in the aforementioned embodiment, the present invention is not restricted to this. For example, the heat pipes may alternatively be divided into a plurality of pieces in the direction X.

While the fasteners are screws in the aforementioned embodiment, the present invention is not restricted to this. For example, the fasteners may alternatively be members other than screws.

While the arrangements of the first semiconductor switching element, the second semiconductor switching element, the third semiconductor switching element, the fourth semiconductor switching element, the first diode element, and the second diode element are the same among the plurality of semiconductor element groups in the aforementioned embodiments, the present invention is not restricted to this. The arrangements of the aforementioned six semiconductor elements may alternatively be different among the plurality of semiconductor element groups.

What is claimed is:
1. A power converter comprising:
a plurality of semiconductor element groups, each including a first semiconductor switching element, a second semiconductor switching element, a third semiconductor switching element, and a fourth semiconductor switching element, connected in series to each other in this order, and being configured such that each of the second semiconductor switching element and the third semiconductor switching element generates larger amount of heat than the first semiconductor switching element and the fourth semiconductor switching element; and
coolers on which the plurality of semiconductor element groups is placed, including a plurality of plate-shaped fins that extends along a first direction, which is a direction in which cooling air flows, wherein the plurality of plate-shaped fins is disposed side by side along a second direction orthogonal to the first direction, and the plurality of semiconductor element groups is disposed side by side along the second direction so as to overlap with the fins on surfaces of the coolers opposite to surfaces on which the fins are provided, and in each of the plurality of semiconductor element groups, the second semiconductor switching element and the third semiconductor switching element are shifted from each other in the second direction such that at least a portion of the fins with which the second semiconductor switching element overlaps as viewed in a direction orthogonal to the surfaces of the coolers is different from the fins with which the third semiconductor switching element overlaps as viewed in the direction orthogonal to the surfaces of the coolers.

2. The power converter according to claim 1, wherein in each of the plurality of semiconductor element groups, the second semiconductor switching element and one of the first semiconductor switching element and the fourth semiconductor switching element are disposed in a first row along the first direction, and the third semiconductor switching element and the other of the first semiconductor switching element and the fourth semiconductor switching element are disposed in a second row along the first direction.

3. The power converter according to claim 2, wherein each of the plurality of semiconductor element groups includes a first diode element and a second diode element provided between a connection point between the first semiconductor switching element and the second semiconductor switching element and a connection point between the third semiconductor switching element and the fourth semiconductor switching element, and connected in series to each other, and in each of the plurality of semiconductor element groups, the second semiconductor switching element, one of the first semiconductor switching element and the fourth semiconductor switching element, and the first diode element are disposed in the first row along the first direction, and the third semiconductor switching element, the other of the first semiconductor switching element and the fourth semiconductor switching element, and the second diode element are disposed in the second row along the first direction.

4. The power converter according to claim 3, further comprising a power converter main body including the plurality of semiconductor element groups, wherein the power converter main body is configured for a railroad vehicle, the plurality of plate-shaped fins of the coolers extends along the first direction, which is a traveling direction of the railroad vehicle, and in each of the plurality of semiconductor element groups, the second semiconductor switching element is disposed between the first diode element and one of the first semiconductor switching element and the fourth semiconductor switching element in the first direction, and the third semiconductor switching element is disposed between the second diode element and the other of the first semiconductor switching element and the fourth semiconductor switching element in the first direction.

5. The power converter according to claim 1, wherein the plurality of semiconductor element groups includes a first semiconductor element group forming a converter that converts an alternating current to a direct current and a second semiconductor element group forming an inverter that converts a direct current to an alternating current, and at least in the first semiconductor element group, the second semiconductor switching element and the third semiconductor switching element are shifted from each other in the second direction such that at least the portion of the fins with which the second semiconductor switching element overlaps as viewed in the direction orthogonal to the surfaces of the coolers is different from the fins with which the third semiconductor switching element overlaps as viewed in the direction orthogonal to the surfaces of the coolers.

6. The power converter according to claim 1, wherein the coolers each include a base to which the plurality of plate-shaped fins is attached, the power converter further comprising a plurality of fasteners by which each of the first semiconductor switching element, the second semiconductor switching element, the third semiconductor switching element, and the fourth semiconductor switching element is attached to each of the coolers; and a heat pipe provided inside the base of each of the coolers and extending along the first direction, wherein the plurality of fasteners is disposed side by side along the first direction, which is a direction in which the heat pipe extends.

7. The power converter according to claim 6, wherein the first semiconductor switching element, the second semiconductor switching element, the third semiconductor switching element, and the fourth semiconductor switching element are respectively housed in modules each having a substantially rectangular shape as viewed in the direction orthogonal to the surfaces of the coolers, and the fasteners are provided along two sides of each of the modules in the first direction.

8. The power converter according to claim 1, wherein in each of the plurality of semiconductor element groups, the second semiconductor switching element and the third semiconductor switching element are placed on the surface of each of the coolers such that the fins with which the second semiconductor switching element overlaps as viewed in the direction orthogonal to the surfaces of the coolers are different from the fins with which the third semiconductor switching element overlaps as viewed in the direction orthogonal to the surfaces of the coolers.

9. A power converter for a railroad vehicle, comprising:
a plurality of semiconductor element groups each including a first semiconductor switching element, a second semiconductor switching element, a third semiconductor switching element, and a fourth semiconductor switching element connected in series to each other in this order, and being configured such that each of the second semiconductor switching element and the third semiconductor switching element generates larger amount of heat than the first semiconductor switching element and the fourth semiconductor switching element; and coolers on which the plurality of semiconductor element groups is placed, including a plurality of plate-shaped fins that extends along a first direction, which is a traveling direction of the railroad vehicle, wherein the plurality of plate-shaped fins is disposed side by side along a second direction orthogonal to the first direction, and the plurality of semiconductor element groups is disposed side by side along the second direction so as to overlap with the fins on surfaces of the coolers opposite to surfaces on which the fins are provided, and in each of the plurality of semiconductor element groups, the second semiconductor switching element and the third semiconductor switching element are shifted from each other in the second direction such that at least a portion of the fins with which the second semiconductor switching element overlaps as viewed in a direction orthogonal to the surfaces of the coolers is different from the fins with which the third semiconductor switching element overlaps as viewed in the direction orthogonal to the surfaces of the coolers.

10. A power converter comprising:
a plurality of semiconductor element groups, each including a first semiconductor switching element, a second semiconductor switching element, a third semiconductor switching element, and a fourth semiconductor switching element, connected in series to each other in this order;
coolers on which the plurality of semiconductor element groups is placed, including a plurality of plate-shaped fins that extends along a first direction, which is a direction in which cooling air flows;
a plurality of fasteners by which each of the first semiconductor switching element, the second semiconductor switching element, the third semiconductor switching element, and the fourth semiconductor switching element is attached to each of the coolers; and
a heat pipe extending along the first direction, wherein
the plurality of plate-shaped fins is disposed side by side along a second direction orthogonal to the first direction,
the plurality of semiconductor element groups is disposed side by side along the second direction so as to overlap with the plurality of plate-shaped fins on surfaces of the coolers opposite to surfaces on which the plurality of plate-shaped fins is provided, and in each of the plurality of semiconductor element groups, the second semiconductor switching element and the third semiconductor switching element are shifted from each other in the second direction such that at least a portion of the plurality of plate-shaped fins with which the second semiconductor switching element overlaps as viewed in a direction orthogonal to the surfaces of the coolers is different from the plurality of plate-shaped fins with which the third semiconductor switching element overlaps as viewed in the direction orthogonal to the surfaces of the coolers,
each of the coolers includes a base to which the plurality of plate-shaped fins is attached, and the heat pipe is provided inside the base of each of the coolers, and
the plurality of fasteners is disposed side by side along the first direction, which is a direction in which the heat pipe extends.

11. The power converter according to claim 1, wherein the second semiconductor switching element and the third semiconductor switching element are disposed between the first semiconductor switching element and the fourth semiconductor switching element.

12. The power converter according to claim 1, wherein each of the plurality of semiconductor element groups further includes a capacitor connected between one end of the first semiconductor switching element and the other end of the fourth semiconductor switching element in parallel.

* * * * *